United States Patent
Ji

(10) Patent No.: US 10,673,474 B2
(45) Date of Patent: Jun. 2, 2020

(54) ANTI-INTERFERENCE METHOD AND CIRCUIT, AND MOBILE TERMINAL

(71) Applicant: ZTE CORPORATION, Shenzhen, Guangdong (CN)

(72) Inventor: Xiaoyu Ji, Shenzhen (CN)

(73) Assignee: ZTE CORPORATION, Shenzhen, Guangdong (CN)

( * ) Notice: Subject to any disclaimer, the term of this patent is extended or adjusted under 35 U.S.C. 154(b) by 0 days.

(21) Appl. No.: 16/090,729

(22) PCT Filed: Jul. 4, 2016

(86) PCT No.: PCT/CN2016/088440
§ 371 (c)(1),
(2) Date: Oct. 2, 2018

(87) PCT Pub. No.: WO2017/173741
PCT Pub. Date: Oct. 12, 2017

(65) Prior Publication Data
US 2019/0115940 A1    Apr. 18, 2019

(30) Foreign Application Priority Data
Apr. 7, 2016  (CN) .......................... 2016 1 0212856

(51) Int. Cl.
*H04B 1/10*        (2006.01)
*H04B 15/02*      (2006.01)
(Continued)

(52) U.S. Cl.
CPC ............ *H04B 1/0475* (2013.01); *H01Q 1/36* (2013.01); *H04B 1/04* (2013.01); *H04B 15/02* (2013.01);
(Continued)

(58) Field of Classification Search
CPC ... H04B 1/10; H04B 1/12; H04B 1/16; H04B 15/00; H04B 15/02; H04B 1/0475; H04B 2001/0418; H01Q 1/36
See application file for complete search history.

(56) References Cited

U.S. PATENT DOCUMENTS

| | | | |
|---|---|---|---|
| 3,167,761 A * | 1/1965 | Le Parquier | G01S 13/02 342/89 |
| 4,644,359 A * | 2/1987 | Katagi | H01Q 3/2629 342/14 |

(Continued)

FOREIGN PATENT DOCUMENTS

| | | |
|---|---|---|
| CN | 102823142 A | 12/2012 |
| CN | 102956235 A | 3/2013 |

(Continued)

OTHER PUBLICATIONS

International Search Report for International Appl. No. PCT/CN2016/088440, dated Dec. 29, 2016.

(Continued)

*Primary Examiner* — Blane J Jackson
(74) *Attorney, Agent, or Firm* — Foley & Lardner LLP

(57) ABSTRACT

Provided is anti-interference method and circuit, and a mobile terminal. The method includes: eliciting a target interference signal to be suppressed from an interference source; performing phase reversal processing on the elicited target interference signal; performing amplitude modulation processing according to a target amplitude value of the target interference signal to obtain an interference suppression signal, where the interference suppression signal and the target interference signal to be suppressed are opposite in phase and the interference suppression signal has an amplitude value less than or equal to the target amplitude value; and suppressing the target interference signal in the interference source using the obtained interference suppression signal.

16 Claims, 2 Drawing Sheets

(51) Int. Cl.
     *H01Q 1/36*     (2006.01)
     *H04B 1/04*     (2006.01)
     *H03H 7/01*     (2006.01)

(52) U.S. Cl.
     CPC ....... *H03H 7/01* (2013.01); *H04B 2001/0408* (2013.01)

(56) References Cited

U.S. PATENT DOCUMENTS

| | | | |
|---|---|---|---|
| 6,289,004 B1* | 9/2001 | Mesecher | H01Q 1/246 370/286 |
| 7,519,395 B2* | 4/2009 | Mesecher | H01Q 1/246 342/73 |
| 2005/0003864 A1 | 1/2005 | Elliot et al. | |
| 2011/0171922 A1* | 7/2011 | Kim | H04B 1/525 455/307 |
| 2012/0178386 A1 | 7/2012 | Campbell et al. | |
| 2013/0005284 A1* | 1/2013 | Dalipi | H03F 1/3229 455/114.3 |
| 2014/0011461 A1 | 1/2014 | Bakalski et al. | |
| 2017/0019128 A1* | 1/2017 | Pack | H04B 1/0475 |
| 2017/0104506 A1* | 4/2017 | Liu | H04B 1/1027 |
| 2018/0309475 A1* | 10/2018 | Kim | H04B 15/02 |

FOREIGN PATENT DOCUMENTS

| | | |
|---|---|---|
| CN | 103532588 A | 1/2014 |
| CN | 104348497 A | 2/2015 |

OTHER PUBLICATIONS

Extended European Search Report for EP Appl. No. 16897674.4, dated Nov. 5, 2019.

\* cited by examiner

ANTI-INTERFERENCE METHOD AND CIRCUIT, AND MOBILE TERMINAL

CROSS-REFERENCE TO RELATED APPLICATIONS

This is a National Stage Application, filed under 35 U.S.C. 371, of International Patent Application No. PCT/CN2016/088440, filed on Jul. 4, 2016, which claims priority to Chinese patent application No. 201610212856.4 filed on Apr. 7, 2016, the contents of both of which are incorporated herein by reference in their entireties.

TECHNICAL FIELD

The present disclosure relates to, but is not limited to, the communication field and, in particular, relates to an anti-interference method and circuit, and a mobile terminal.

BACKGROUND

At present, mobile phones have many interference sources which cause serious interference to radio frequency reception. In the related art, an interference source is enclosed by a shield. For example, a shielding rib and a shielding case are combined to enclose the interference source and block a transmission path of an interference signal so that the interference signal is reflected multiple times in a shielding cavity and is reduced finally. However, this manner is not applicable to high devices which cannot be enclosed, connectors and the like. Furthermore, this manner in the related art has poor stability and reliability, leading to frequent occurrence of probabilistic failures.

SUMMARY

The following is a summary of the subject matter described in detail in the present application.

This summary is not intended to limit the scope of the claims.

The present application provides an anti-interference method and circuit, and a mobile terminal, which solve the problem in the related art that the anti-interference achieve by enclosing the interference source has poor stability, reliability and universality and a high failure rate.

The present application provides an anti-interference method. The method includes the following steps:

a target interference signal to be suppressed is elicited from an interference source;

phase reversal processing is performed on the elicited target interference signal;

amplitude modulation processing is performed on the target interference signal subject to phase reversal processing according to a target amplitude value of the target interference signal to obtain an interference suppression signal; where interference suppression signal and the target interference signal are opposite in phase, and the interference suppression signal has an amplitude value less than or equal to the target amplitude value; and the target interference signal is suppressed by using the interference suppression signal.

In an embodiment, in the above method, the step in which the target interference signal is suppressed by using the interference suppression signal includes any one of the following manners:

manner 1: When the target interference signal radiates out, the interference suppression signal radiates out from a directional radiation antenna, where a distance between the directional radiation antenna and the interference source is less than a set threshold.

manner 2: Before the target interference signal radiates out, the interference suppression signal is introduced into the interference source to suppress the target interference signal, where the target interference signal has an amplitude value less than the target amplitude value.

In an embodiment, in the above method, when the target interference signal is suppressed in the manner 1, before the phase reversal processing is performed on the elicited target interference signal, the method further includes the following step:

phase compensation processing is performed on the target interference signal according to a difference between a radiation path of the directional radiation antenna and a radiation path of the target interference signal.

In an embodiment, in the above method, when the target interference signal is suppressed in the manner 1, the directional radiation antenna is a helical antenna.

In an embodiment, in the above method, after the target interference signal is elicited from the interference source and before the phase reversal processing is performed on the target interference signal, the method further includes the following step:

a direct current component in the target interference signal is filtered.

Alternatively, after the phase reversal processing is performed on the target interference signal and before the amplitude modulation processing is performed on the target interference signal subject to phase reversal processing according to the target amplitude value of the target interference signal, the method further includes the following step:

the direct current component in the target interference signal is filtered.

The present application further provides an anti-interference circuit. The circuit includes a signal eliciting circuit, a phase reversal circuit, an amplitude modulation circuit and a suppressing circuit.

The signal eliciting circuit is configured to elicit a target interference signal to be suppressed from an interference source.

The phase reversal circuit is configured to perform phase reversal processing on the target interference signal.

The amplitude modulation circuit is configured to perform amplitude modulation processing on the target interference signal subject to phase reversal processing according to a target amplitude value of the target interference signal to obtain an interference suppression signal. The interference suppression signal and the target interference signal are opposite in phase, and the interference suppression signal has an amplitude value less than or equal to the target amplitude value.

The suppressing circuit is configured to suppress the target interference signal using the interference suppression signal.

In an embodiment, in the above anti-interference circuit, the suppressing circuit includes a directional radiation antenna or a feedback circuit.

The directional radiation antenna is configured to radiate the interference suppression signal out when the target interference signal radiates out, where a distance between the directional radiation antenna and the interference source is less than a set threshold.

The feedback circuit is configured to introduce the interference suppression signal into the interference source to suppress the target interference signal before the target interference signal radiates out, where the target interference signal has an amplitude value less than the target amplitude value.

In an embodiment, in the above anti-interference circuit, when the suppressing circuit includes the directional radiation antenna, the anti-interference circuit further includes a phase adjustment circuit.

The phase adjustment circuit is configured to perform phase compensation processing on the target interference signal according to a difference between a radiation path of the directional radiation antenna and a radiation path of the target interference signal before the phase reversal circuit performs phase reversal processing on the target interference signal.

In an embodiment, in the above anti-interference circuit, when the suppressing circuit includes the directional radiation antenna, the directional radiation antenna is a helical antenna.

In an embodiment, the above anti-interference circuit further includes a direct current filtering circuit.

The direct current filtering circuit is configured to filter a direct current component in the target interference signal after the signal eliciting circuit elicits the target interference signal from the interference source and before the phase reversal circuit performs phase reversal processing on the target interference signal.

Alternatively, the direct current filtering circuit is configured to filter the direct current component in the target interference signal after the phase reversal circuit performs phase reversal processing on the target interference signal and before the amplitude modulation circuit performs amplitude modulation processing on the target interference signal subject to phase reversal processing according to the target amplitude value of the target interference signal.

The present application further provides a mobile terminal including a working circuit and the above anti-interference circuit. The anti-interference circuit is connected to an interference source of the working circuit and the anti-interference circuit suppresses a target interference signal in the interference source.

In the anti-interference method and circuit and the mobile terminal provided by the present application, the target interference signal to be suppressed is elicited form an interference source; the phase reversal processing is performed on the elicited target interference signal; the amplitude modulation processing is performed on the target interference signal subject to the phase reversal processing according to the target amplitude value of the target interference signal to obtain the interference suppression signal, where the interference suppression signal and the target interference signal to be suppressed are opposite in phase and the interference suppression signal has an amplitude value less than or equal to the target amplitude value; and the target interference signal in the interference source is suppressed using the obtained interference suppression signal. In this way, the interference may be directly suppressed and eliminated from the interference source. This may greatly reduce the dependence on a shielding case, achieving better stability and reliability and a lower failure rate compared with the use of shielding case in the related art. This is applicable to various types of interference sources including high devices which cannot be shielded by the shielding case, connectors and the like.

Other aspects can be understood after the accompanying drawings and detailed description are read and understood.

DETAILED DESCRIPTION

Embodiments of the present application will be described below in detail with reference to the accompanying drawings. If not in collision, the embodiments described herein and the features thereof may be combined with each other.

In the present application, a target interference signal to be eliminated may be directly elicited from the interference source in a terminal; an interference suppression signal is obtained based on the target interference signal, the interference suppression signal having a phase opposite to a phase of the target interference signal and an amplitude less than or equal to an amplitude of the target interference signal; and the interference suppression signal is used for suppressing the target interference signal. Compared with the use of shielding case in the related art, this has higher universality, stability and reliability, and a lower failure rate. The embodiments of the present disclosure will be described in detail with reference to the accompanying drawings.

Embodiment 1

Figure 1:
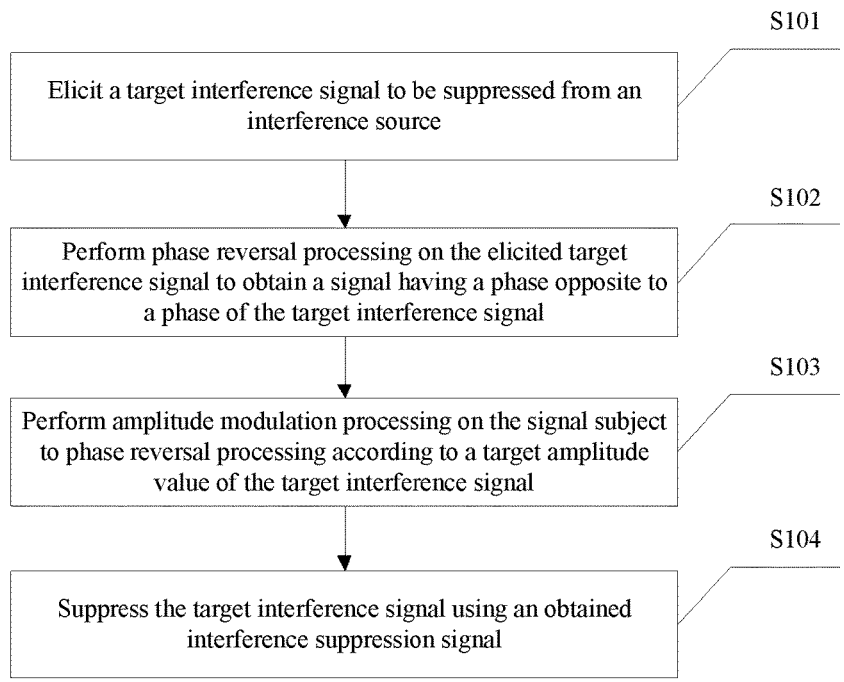
FIG. 1 is a flowchart of an anti-interference method according to an embodiment 1 of the present disclosure.

Referring to FIG. 1, an anti-interference method provided by this embodiment includes steps 101 to 104 described below.

In step 101, a target interference signal to be suppressed is elicited from an interference source.

In an embodiment, the interference source here may be one or more kinds of interference sources in a terminal. In particular, the interference source here may be one or more kinds of interference sources in one or more kinds of mobile terminals (e.g., mobile phones and iPads).

In step 102, phase reversal processing is performed on the elicited target interference signal to obtain a signal having a phase opposite to a phase of the target interference signal.

In step 103, amplitude modulation processing is performed on the signal obtained subject to phase reversal processing according to a target amplitude value of the target interference signal to obtain an interference suppression signal. The interference suppression signal and the target interference signal are opposite in phase, and the interference suppression signal has an amplitude value less than or equal to the target amplitude value.

In step 104, the target interference signal is suppressed by using the obtained interference suppression signal.

It should be understood that, the elicited target interference signal in this embodiment is first subject to phase reversal processing and then subject to amplitude modulation processing. Of course, it should be understood that the elicited target interference signal in this embodiment may be first subject to amplitude modulation processing and then subject to phase reversal processing.

In this embodiment, to eliminate the influence of a direct current component in the target interference signal, the direct current component in the target interference signal may first be filtered after the target interference signal is elicited from the interference source in the above step 101 and before the phase reversal processing is performed on the target interference signal. In an embodiment, the direct current component in the target interference signal may be filtered after the phase reversal processing is performed on the elicited target interference signal to obtain the signal having the phase opposite to the phase of the target interference signal in the step 102 and before the amplitude modulation processing is performed on the signal obtained by phase reversal processing according to the target amplitude value of the target interference signal. In an embodiment, a direct current filtering circuit may be used for filtering the direct current component in the target interference signal.

In an embodiment, in the above step 102, the phase reversal processing performed on the target interference signal may be implemented by a phase reversal circuit. It should be understood that the phase reversal circuit in this embodiment may adopt one or more structures and types as long as the phase reversal can be implemented. For example, an inverter may be used for implementing phase reversal.

In an embodiment, in the above step 103, the amplitude modulation processing performed on the target interference signal subject to the phase reversal processing may be implemented by different amplitude modulation circuits, for example, an amplifier. The amplitude value of amplitude modulation may be determined according to a current amplitude value of the elicited target interference signal. When an amplifier is used, the amplifier needs to be supplied with power. In this embodiment, the amplifier may be turned on or off with an enable switching signal. For example, the amplifier may be connected to a corresponding controller (for example, a baseband processing chip), and the amplifier can work normally only after the enable switching signal delivered by the controller is received. At this time, the entire anti-interference circuit can work normally.

In an embodiment, in the above step 104, the target interference signal may be suppressed by using the interference suppression signal in two manners. One manner is to eliminate an interference signal using the obtained interference suppression signal during the transmission of the interference signal. The other manner is to eliminate the interference signal by feeding the obtained interference suppression signal back to the interference source before the interference signal radiates out. The above two manners are respectively illustrated below.

In a manner 1, after the interference suppression signal is obtained, the interference suppression signal radiates out from a directional radiation antenna while the target interference signal in the interference source radiates out. The directional radiation antenna is disposed close to the interference source (i.e., the distance between the directional radiation antenna and the interference source is less than a set threshold) to ensure that a radiation path of the directional radiation antenna is substantially the same as a radiation path of the target interference signal. That is, it ensures as far as possible that the radiation path of the target interference signal to a working antenna of a terminal is as identical as possible to the radiation path of the interference suppression signal radiating out from the directional radiation antenna to the working antenna of the terminal. In this way, the target interference signal may be eliminated by the interference suppression signal during the transmission of the target interference signal to the working antenna. In this manner, as long as the phase and amplitude modulation are controlled properly, the interference signal may be eliminated when the interference suppression signal and the target interference signal have equal amplitude values. The directional radiation antenna in this embodiment may be one or more kinds of antennas which can implement directional radiation, such as a helical antenna.

In an embodiment, in the above suppression manner, the directional radiation antenna is disposed as close as possible to the interference source to ensure that they have as identical radiation paths as possible. However, the positions of the directional radiation antenna and the interference source cannot overlap completely due to one or more limitations with respect to physical arrangement. Therefore, in this embodiment, to improve the anti-interference effect, before the target interference signal is elicited or before the phase reversal processing is performed on the target interference signal, phase compensation processing may be performed on the target interference signal according to the difference between the radiation path of the directional radiation antenna and the radiation path of the interference signal. In this way, the interference suppression signal and the target interference signal may overlap as much as possible in the transmission process, so as to eliminate the target interference signal as much as possible.

In a manner 2, after the interference suppression signal is obtained, the interference suppression signal is fed back and introduced into the interference source to suppress the target interference signal before the target interference signal radiates out. At this time, the obtained interference suppression signal has an amplitude value less than or equal to the amplitude value of the target interference signal. In this way, when the interference suppression signal is fed back and introduced into the interference source, a part of the target interference signal is guaranteed to be offset, and a part which has not been offset is used as a source signal for subsequent sampling to generate the interference suppression signal. The part which has not been offset should be as small as possible, as long as this part is enough to generate the interference suppression signal. In this manner, the interference suppression signal and the target interference signal are aligned to greatly weaken the target interference signal before the target interference signal radiates out. At this time, if the current interference source may be provided with a shielding case, the shielding case may be combined to suppress the little part of the target interference signal radiating out. The double suppression of the interference signal may be achieved.

It should be understood that the anti-interference method in this embodiment is applicable to one or more types of mobile terminals including a mobile phone, an iPad, etc. The anti-interference method may be implemented by one or more devices using a combination of software and hardware or circuits that implement the above steps. These devices or circuits may be used as long as their principles of implementing anti-interference are the same as the method disclosed in this embodiment.

Embodiment 2

Figure 2:
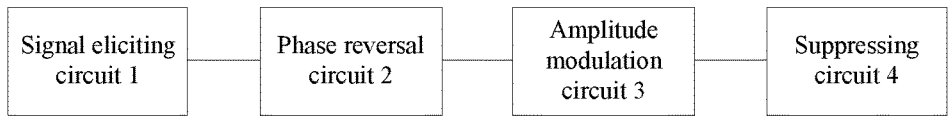
FIG. 2 is a structural diagram 1 of an anti-interference circuit according to an embodiment 2 of the present disclosure.

As shown in FIG. 2, this embodiment provides an anti-interference circuit. The circuit includes a signal eliciting circuit 1, a phase reversal circuit 2, an amplitude modulation circuit 3 and a suppressing circuit 4.

The signal eliciting circuit 1 is configured to elicit a target interference signal to be suppressed from an interference source.

In an embodiment, the interference source here may be one or more interference sources in a terminal.

The phase reversal circuit 2 is configured to perform phase reversal processing on the target interference signal elicited by the signal eliciting circuit 1.

The amplitude modulation circuit 3 is configured to perform amplitude modulation processing on the target interference signal subject to phase reversal processing according to a target amplitude value of the target interference signal to obtain an interference suppression signal. The interference suppression signal and the target interference signal are opposite in phase, and the interference suppression signal has an amplitude value less than or equal to the target amplitude value.

The suppressing circuit 4 is configured to suppress the target interference signal using the interference suppression signal.

Figure 3:
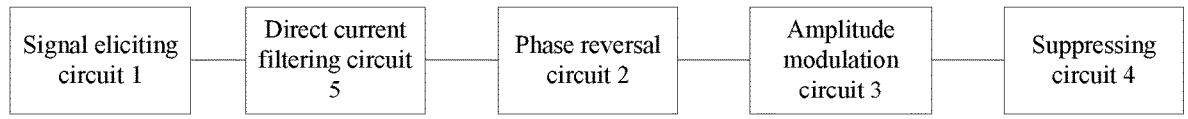
FIG. 3 is a structural diagram 2 of an anti-interference circuit according to the embodiment 2 of the present disclosure.

As shown in FIG. 3, in this embodiment, to eliminate the influence of a direct current component in the target interference signal, the anti-interference circuit further includes a direct current filtering circuit 5. The direct current filtering circuit 5 is configured to filter the direct current component in the target interference signal after the signal eliciting circuit 1 elicits the target interference signal from the interference source and before the phase reversal circuit 2 performs the phase reversal processing on the target interference signal. Alternatively, the direct current filtering circuit 5 is configured to filter the direct current component in the target interference signal after the phase reversal circuit 2 performs the phase reversal processing on the target interference signal and before the amplitude modulation circuit 3 performs the amplitude modulation processing on the signal subject to phase reversal processing. The direct current filtering circuit 5 in this embodiment may be implemented by a direct current filtering capacitor.

The phase reversal circuit 2 in this embodiment may be phase reversal circuits of one or more structures and types as long as these circuits can implement phase reversal. For example, an inverter may be used for implementing phase reversal. The amplitude modulation circuit 3 may be implemented by an amplifier. An amplitude value of amplitude modulation may be determined according to a current target amplitude value of the elicited target interference signal. In an embodiment, when an amplifier is used, the anti-interference circuit may further include a power supply for supplying the amplifier with power. In this embodiment, the amplifier may be turned on or off with an enable switching signal. For example, the amplifier may be connected to a corresponding controller (for example, a baseband processing chip), and the amplifier can work normally only after the enable switching signal delivered by the controller is received. At this time, the entire anti-interference circuit can work normally.

In an embodiment, the suppressing circuit 4 suppresses the target interference signal by using the interference suppression signal in two manners. One manner is to eliminate an interference signal using the obtained interference suppression signal during the transmission of the interference signal. The other manner is to eliminate the interference signal by feeding the obtained interference suppression signal back to the interference source before the interference signal radiates out. The above two manners are respectively illustrated below.

In a manner 1, the suppressing circuit 4 includes a directional radiation antenna. The directional radiation antenna is configured to radiate the interference suppression signal out when the target interference signal radiates out. The directional radiation antenna is disposed close to the interference source (i.e., the distance between the directional radiation antenna and the interference source is less than a set threshold) to ensure that a radiation path of the directional radiation antenna is substantially the same as a radiation path of the target interference signal. That is, it ensures as far as possible that the radiation path of the target interference signal to a working antenna of a terminal is as identical as possible to the radiation path of the interference suppression signal radiating out from the directional radiation antenna to the working antenna of the terminal. In this way, the target interference signal may be eliminated by the interference suppression signal during the transmission of the target interference signal to the working antenna. In this manner, as long as the phase and amplitude modulation are controlled properly, the interference signal may be eliminated when the interference suppression signal and the target interference signal have equal amplitude values. The directional radiation antenna in this embodiment may be one or more kinds of antennas which can implement directional radiation, such as a helical antenna.

In the manner 1, the directional radiation antenna is disposed as close as possible to the interference source to ensure that they have as identical radiation paths as possible. However, the positions of the directional radiation antenna and the interference source cannot overlap completely due to one or more limitations with respect to physical arrangement. Therefore, in this embodiment, to improve the anti-interference effect, before the target interference signal is elicited or before the phase reversal processing is performed on the target interference signal, a phase adjustment circuit may be used for performing phase compensation processing on the target interference signal according to the difference between the radiation path of the directional radiation antenna and the radiation path of the interference signal. In this way, the interference suppression signal and the target interference signal may overlap as much as possible in the transmission process, so as to eliminate the target interference signal as much as possible.

In this embodiment, during phase adjustment and amplitude adjustment, a spectrum analyzer may be used for testing the target interference signal outputted from the interference source and a signal outputted from the amplifier. If the two signals have the same spectrum form and amplitude, the amplitude adjustment may be considered to be successful. The phase adjustment may be implemented by a coupled antenna. The spectrum analyzer uses the coupled antenna to scan the vicinity of the interference source. When the radiant quantity reaches a minimum value, the phase adjustment may be considered to be completed.

In an embodiment, to adjust the helical antenna, a tool such as EMCscan may be used for testing the interference source to obtain a pattern and the helical antenna is pulled away to test a pattern of the helical antenna. A simple helical antenna is adjusted to ensure that the simple helical antenna and the interference source have basically consistent patterns.

Example 1

Figure 4:
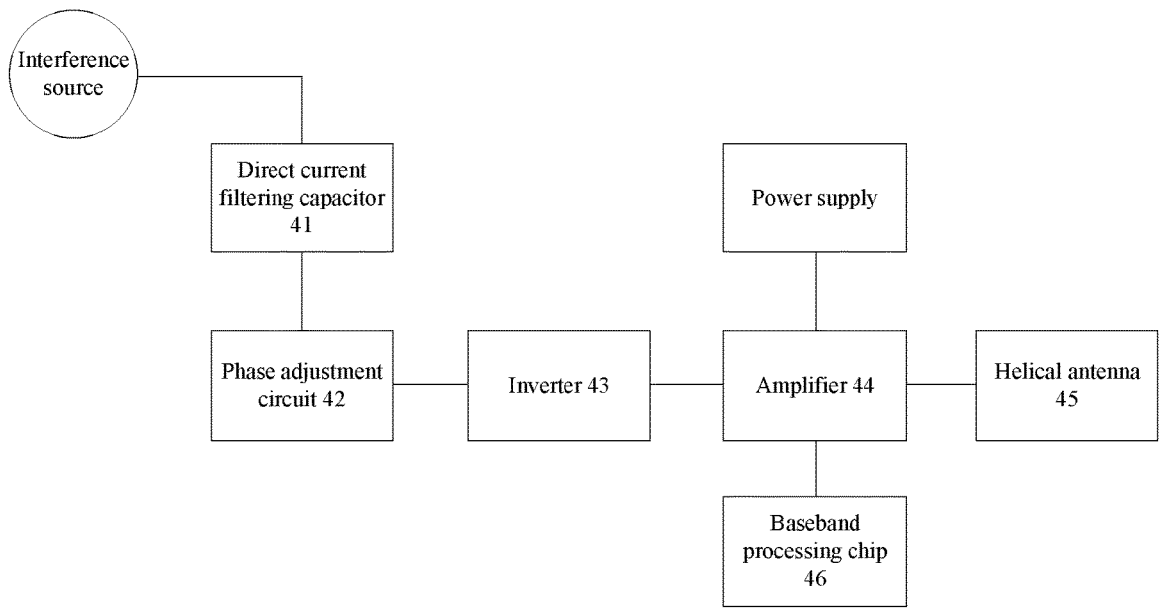
FIG. 4 is a structural diagram of an anti-interference circuit including a helical antenna according to the embodiment 2 of the present disclosure.

In the manner 1, the signal eliciting circuit 1 may be simply connected to a signal line of the interference source to elicit the target interference signal to be eliminated from the interference source. The direct current filtering circuit 5 may be implemented by a direct current filtering capacitor. The phase reversal circuit and the amplitude modulation circuit 3 may be separately implemented by an inverter and an amplifier, and a controller of the amplifier may be implemented by a baseband processing chip. As shown in FIG. 4, a direct current filtering capacitor 41 filters the direct current component in the target interference signal elicited from the interference source; a phase adjustment circuit 42 performs phase compensation and adjustment processing on the target interference signal according to the difference between the radiation path of the directional radiation antenna and the radiation path of the interference signal; an inverter 43 performs phase reversal processing on the target interference signal; an amplifier 44 appropriately amplifies the amplitude value of the processed target interference signal to be equal to the amplitude value of the original target interference signal; and finally, a helical antenna 45 radiates the interference suppression signal to the working antenna of the terminal directionally to offset the target interference signal radiating to the working antenna. In this embodiment, the baseband processing chip 46 may turn off the amplifier when the terminal is in an inactive state (e.g., standby), thereby reducing power consumption of the terminal.

Example 2

In the manner 2, the suppressing circuit 4 includes a feedback circuit. The feedback circuit is configured to introduce the interference suppression signal into the interference source to offset a part of the target interference signal before the target interference signal radiates out. At this time, the obtained interference suppression signal has an amplitude value less than or equal to the amplitude value of the target interference signal. In this way, when the interference suppression signal is fed back and introduced into the interference source, a part of the target interference signal is guaranteed to be offset, and a part which has not been offset is used as a source signal for subsequent sampling to generate the interference suppression signal. In addition, the part which has not been offset should be as small as possible, as long as it can generate the interference suppression signal. In this manner, the interference suppression signal and the target interference signal are aligned to greatly weaken the target interference signal before the target interference signal radiates out. At this time, if the current interference source may be provided with a shielding case, the shielding case may be combined to suppress the little part of the target interference signal radiating out. The double suppression of the interference signal may be achieved.

Figure 5:
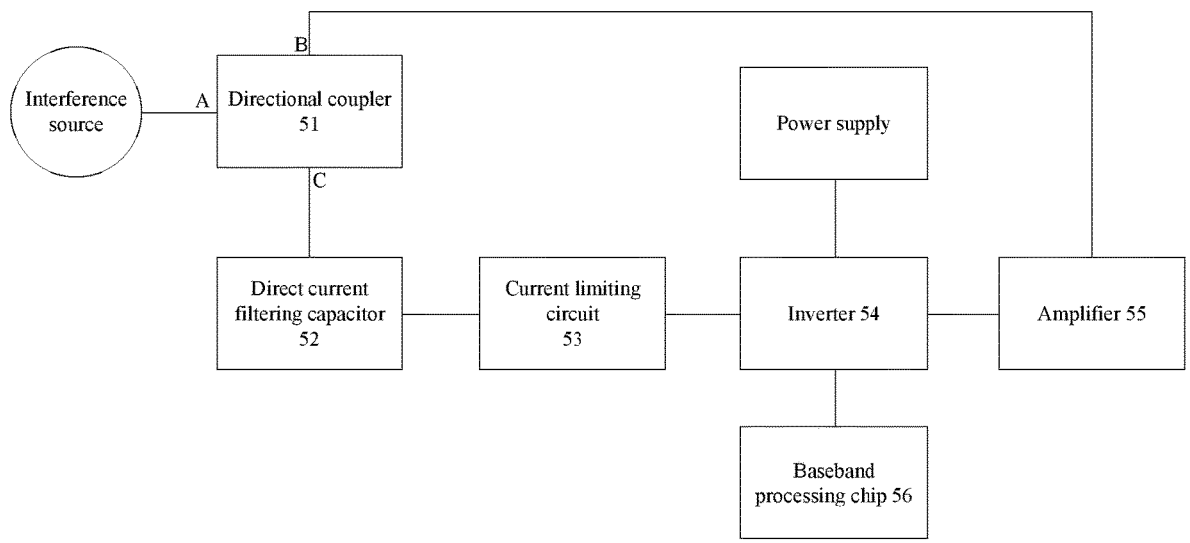
FIG. 5 is a structural diagram of an anti-interference circuit including a directional coupler according to the embodiment 2 of the present disclosure.

In the manner 2, to avoid forward self-excitation during phase adjustment and amplitude adjustment, a current limiting circuit may be added to the anti-interference circuit. In the manner 2, the signal eliciting circuit 1 and the feedback circuit may be implemented based on a directional coupler. The direct current filtering circuit 5 may be implemented by a direct current filtering capacitor. The phase reversal circuit and the amplitude modulation circuit 3 may be separately implemented by an inverter and an amplifier, and a controller of the amplifier may be implemented by a baseband processing chip. As shown in FIG. 5, in a directional coupler 51, a port A and a port C are directly connected, the port A and a port B are coupled, and the port B and the port C are isolated. The signal is transferred from the port A to the port C without loss and is transmitted from the port A to the port B through coupling, while the port B is isolated from the port C. The directional coupler 51 elicits the target interference signal from the interference source and transmits the target interference signal, from A to C, to a direct current filtering capacitor 52 to filter the direct current component therein; a current-limited circuit 53 processes the target interference signal; an inverter 54 performs phase reversal processing on the target interference signal; an amplifier 55 appropriately amplifies the amplitude of the processed target interference signal (the amplitude value of the amplified target interference signal is slightly smaller than the amplitude value of the original target interference signal; for example, if the amplitude value of the target interference signal is 30, the amplified amplitude value is 25-28); and finally, the interference suppression signal is outputted to port B of the coupler 51 and is fed back to the interference source through the path from A to B of the directional coupler 51, so as to partially offset the target interference signal. In this example, the baseband processing chip 56 may also turn off the amplifier when the terminal is in an inactive state (e.g., on standby), thereby reducing power consumption of the terminal.

Embodiment 3

This embodiment provides a mobile terminal, which may be a mobile phone, an iPad, an iPod, etc. The mobile terminal includes a working circuit and the anti-interference circuit in the embodiment 2. The anti-interference circuit is connected to an interference source of the working circuit, and the anti-interference circuit suppresses a target interference signal in the interference source.

It is understandable by those skilled in the art that all or some steps in the method described above may be completed by relevant hardware (such as a processor) as instructed by programs, and the programs may be stored in a computer-readable storage medium, such as a read-only memory, a magnetic disk and an optical disk. In an embodiment, all or part of the steps in the embodiments described above may also be implemented by using one or more integrated circuits. Accordingly, the modules/units in the embodiments described above may be implemented by hardware. For example, the functions of these modules/units may be implemented by one or more integrated circuits. Alternatively, these modules/units may be implemented by software function modules. For example, the functions of these modules/units may be implemented by using a processor to execute programs/instructions stored in a storage medium. The present application is not limited to any specific combination of hardware and software.

INDUSTRIAL APPLICABILITY

The embodiments of the present disclosure may directly eliminate or suppress interference from the radiation at the source and greatly reduce the dependence on a shielding frame or case, improve anti-interference stability and reliability, decrease a failure rate and improve user experience. The present disclosure may be applied to a high device which cannot be shielded or a connector. Instead of using a shielding case to "block" the interference, the present disclosure offsets interference by phase reversal and converts alternate current energy into direct current energy to restore energy to a power supply.

What is claimed is:

1. An anti-interference method, comprising:

eliciting a target interference signal to be suppressed from an interference source;

performing phase reversal processing on the elicited target interference signal;

performing amplitude modulation processing on the target interference signal subject to phase reversal processing according to a target amplitude value of the target interference signal to obtain an interference suppression signal, wherein the interference suppression signal and the target interference signal are opposite in phase, and the interference suppression signal has an amplitude value less than or equal to the target amplitude value; and suppressing the target interference signal using the interference suppression signal;

wherein the suppressing the target interference signal using the interference suppression signal comprises any one of the following manners;

manner 1: when the target interference signal radiates out, the interference suppression signal radiates out from a directional radiation antenna, wherein a distance between the directional radiation antenna and the interference source is less than a set threshold; or manner 2: before the target interference signal radiates out, the interference suppression signal is introduced into the interference source to suppress the target interference signal, wherein the target interference signal has an amplitude value less than the target amplitude value.

2. The anti-interference method according to claim 1, wherein when the target interference signal is suppressed in the manner 1, before the performing phase reversal processing on the elicited target interference signal, the method further comprises:

performing phase compensation processing on the target interference signal according to a difference between a radiation path of the directional radiation antenna and a radiation path of the target interference signal.

3. The anti-interference method according to claim 2, wherein after the eliciting the target interference signal from the interference source and before the performing phase reversal processing on the target interference signal, the method further comprises:

filtering a direct current component in the target interference signal;

or after the performing phase reversal processing on the target interference signal and before the performing amplitude modulation processing on the target interference signal subject to phase reversal processing according to the target amplitude value of the target interference signal, the method further comprises:

filtering the direct current component in the target interference signal.

4. The anti-interference method according to claim 1, wherein when the target interference signal is suppressed in the manner 1, the directional radiation antenna is a helical antenna.

5. The anti-interference method according to claim 4, wherein after the eliciting the target interference signal from the interference source and before the performing phase reversal processing on the target interference signal, the method further comprises:

filtering a direct current component in the target interference signal;

or after the performing phase reversal processing on the target interference signal and before the performing amplitude modulation processing on the target interference signal subject to phase reversal processing according to the target amplitude value of the target interference signal, the method further comprises:

filtering the direct current component in the target interference signal.

6. The anti-interference method according to claim 1, wherein after the eliciting the target interference signal from the interference source and before the performing phase reversal processing on the target interference signal, the method further comprises:

filtering a direct current component in the target interference signal;

or after the performing phase reversal processing on the target interference signal and before the performing amplitude modulation processing on the target interference signal subject to phase reversal processing according to the target amplitude value of the target interference signal, the method further comprises:

filtering the direct current component in the target interference signal.

7. An anti-interference circuit, comprising:

a signal eliciting circuit, which is configured to elicit a target interference signal to be suppressed from an interference source;

a phase reversal circuit, which is configured to perform phase reversal processing on the target interference signal;

an amplitude modulation circuit, which is configured to perform amplitude modulation processing on the target interference signal subject to phase reversal processing according to a target amplitude value of the target interference signal to obtain an interference suppression signal, wherein the interference suppression signal and the target interference signal are opposite in phase, and the interference suppression signal has an amplitude value less than or equal to the target amplitude value; and a suppressing circuit, which is configured to suppress the target interference signal using the interference suppression signal;

wherein the suppressing circuit comprises:

a directional radiation antenna, which is configured to radiate the interference suppression signal out when the target interference signal radiates out, wherein a distance between the directional radiation antenna and the interference source is less than a set threshold, or a feedback circuit, which is configured to introduce the interference suppression signal into the interference source to suppress the target interference signal before the target interference signal radiates out, wherein the target interference signal has an amplitude value less than the target amplitude value.

8. The anti-interference circuit according to claim 7, wherein when the suppressing circuit comprises the directional radiation antenna, the anti-interference circuit further comprises:

a phase adjustment circuit, which is configured to perform phase compensation processing on the target interference signal according to a difference between a radiation path of the directional radiation antenna and a radiation path of the target interference signal before the phase reversal circuit performs phase reversal processing on the target interference signal.

9. The anti-interference circuit according to claim 8, further comprising:

a direct current filtering circuit, which is configured to:
filter a direct current component in the target interference signal after the signal eliciting circuit elicits the target interference signal from the interference source and before the phase reversal circuit performs phase reversal processing on the target interference signal; or
filter the direct current component in the target interference signal after the phase reversal circuit performs phase reversal processing on the target interference signal and before the amplitude modulation circuit performs amplitude modulation processing on the target interference signal subject to phase reversal processing according to the target amplitude value of the target interference signal.

10. The anti-interference circuit according to claim 7, wherein when the suppressing circuit comprises the directional radiation antenna, the directional radiation antenna is a helical antenna.

11. The anti-interference circuit according to claim 10, further comprising:
a direct current filtering circuit, which is configured to:
filter a direct current component in the target interference signal after the signal eliciting circuit elicits the target interference signal from the interference source and before the phase reversal circuit performs phase reversal processing on the target interference signal; or
filter the direct current component in the target interference signal after the phase reversal circuit performs phase reversal processing on the target interference signal and before the amplitude modulation circuit performs amplitude modulation processing on the target interference signal subject to phase reversal processing according to the target amplitude value of the target interference signal.

12. The anti-interference circuit according to claim 6, further comprising:
a direct current filtering circuit, which is configured to:
filter a direct current component in the target interference signal after the signal eliciting circuit elicits the target interference signal from the interference source and before the phase reversal circuit performs phase reversal processing on the target interference signal; or
filter the direct current component in the target interference signal after the phase reversal circuit performs phase reversal processing on the target interference signal and before the amplitude modulation circuit performs amplitude modulation processing on the target interference signal subject to phase reversal processing according to the target amplitude value of the target interference signal.

13. A mobile terminal, comprising a working circuit and an anti-interference circuit,
wherein the anti-interference circuit comprises:
a signal eliciting circuit, which is configured to elicit a target interference signal to be suppressed from an interference source;
a phase reversal circuit, which is configured to perform phase reversal processing on the target interference signal;
an amplitude modulation circuit, which is configured to perform amplitude modulation processing on the target interference signal subject to phase reversal processing according to a target amplitude value of the target interference signal to obtain an interference suppression signal, wherein the interference suppression signal and the target interference signal are opposite in phase, and the interference suppression signal has an amplitude value less than or equal to the target amplitude value; and
a suppressing circuit, which is configured to suppress the target interference signal using the interference suppression signal;
wherein the anti-interference circuit is connected to an interference source of the working circuit and the anti-interference circuit suppresses a target interference signal in the interference source.

14. The mobile terminal according to claim 13, wherein the suppressing circuit comprises:
a directional radiation antenna, which is configured to radiate the interference suppression signal out when the target interference signal radiates out, wherein a distance between the directional radiation antenna and the interference source is less than a set threshold; or
a feedback circuit, which is configured to introduce the interference suppression signal into the interference source to suppress the target interference signal before the target interference signal radiates out, wherein the target interference signal has an amplitude value less than the target amplitude value.

15. The mobile terminal according to claim 13, wherein when the suppressing circuit comprises the directional radiation antenna, the anti-interference circuit further comprises:
a phase adjustment circuit, which is configured to perform phase compensation processing on the target interference signal according to a difference between a radiation path of the directional radiation antenna and a radiation path of the target interference signal before the phase reversal circuit performs phase reversal processing on the target interference signal, or, wherein when the suppressing circuit comprises the directional radiation antenna, the anti-interference circuit further comprises:
a phase adjustment circuit, which is configured to perform phase compensation processing on the target interference signal according to a difference between a radiation path of the directional radiation antenna and a radiation path of the target interference signal before the phase reversal circuit performs phase reversal processing on the target interference signal,
wherein the directional radiation antenna is a helical antenna.

16. The mobile terminal according to claim 13, wherein the anti-interference circuit further comprises:
a direct current filtering circuit, which is configured to:
filter a direct current component in the target interference signal after the signal eliciting circuit elicits the target interference signal from the interference source and before the phase reversal circuit performs phase reversal processing on the target interference signal; or
filter the direct current component in the target interference signal after the phase reversal circuit performs phase reversal processing on the target interference signal and before the amplitude modulation circuit performs amplitude modulation processing on the target interference signal subject to phase reversal processing according to the target amplitude value of the target interference signal.

* * * * *